US009018715B2

(12) United States Patent
Howe et al.

(10) Patent No.: US 9,018,715 B2
(45) Date of Patent: Apr. 28, 2015

(54) GAS-DIFFUSION BARRIERS FOR MEMS ENCAPSULATION

(71) Applicant: Silicon Laboratories Inc., Austin, TX (US)

(72) Inventors: Roger T. Howe, Los Gatos, CA (US); Emmanuel P. Quevy, El Cerrito, CA (US); Zhen Gu, Cupertino, CA (US)

(73) Assignee: Silicon Laboratories Inc., Austin, TX (US)

( * ) Notice: Subject to any disclaimer, the term of this patent is extended or adjusted under 35 U.S.C. 154(b) by 71 days.

(21) Appl. No.: 13/690,112

(22) Filed: Nov. 30, 2012

(65) Prior Publication Data

US 2014/0151820 A1    Jun. 5, 2014

(51) Int. Cl.
*H01L 23/31* (2006.01)
*B81B 7/00* (2006.01)

(52) U.S. Cl.
CPC ..... *H01L 23/3171* (2013.01); *H01L 2924/1461* (2013.01); *H01L 2924/0002* (2013.01); *B81B 7/0038* (2013.01)

(58) Field of Classification Search
CPC ............................................. H01L 2924/1461
USPC .......................................................... 438/51
See application file for complete search history.

(56) References Cited

U.S. PATENT DOCUMENTS

| | | | |
|---|---|---|---|
| 4,992,656 A | 2/1991 | Clauser | |
| 5,656,889 A | 8/1997 | Niiyama et al. | |
| 6,433,401 B1 | 8/2002 | Clark et al. | |
| 6,658,177 B1 | 12/2003 | Chertkow | |
| 6,713,314 B2 * | 3/2004 | Wong et al. | 438/25 |
| 6,777,263 B1 | 8/2004 | Gan et al. | |
| 6,777,267 B2 | 8/2004 | Ruby et al. | |
| 6,822,880 B2 | 11/2004 | Kovacs et al. | |
| 6,897,551 B2 | 5/2005 | Amiotti | |
| 7,104,129 B2 | 9/2006 | Nasiri et al. | |
| 7,166,910 B2 | 1/2007 | Minervini | |
| 7,259,032 B2 | 8/2007 | Murata et al. | |
| 7,560,857 B2 | 7/2009 | Chen et al. | |
| 7,615,395 B2 | 11/2009 | Heuvelman | |
| 7,615,833 B2 * | 11/2009 | Larson et al. | 257/416 |
| 7,633,150 B2 | 12/2009 | Shiraishi | |
| 7,714,274 B2 | 5/2010 | Degertekin et al. | |
| 7,897,503 B2 | 3/2011 | Foster et al. | |
| 7,903,831 B2 | 3/2011 | Song | |
| 8,283,737 B2 * | 10/2012 | Sugizaki | 257/415 |
| 8,288,835 B2 | 10/2012 | Quevy et al. | |
| 8,525,278 B2 * | 9/2013 | Chu et al. | 257/415 |

(Continued)

OTHER PUBLICATIONS

"Interference and Diffraction", http://web.pdx.edu/~bseipel/203-CH23.pdf, downloaded Dec. 18, 2012, 53 pages.

(Continued)

*Primary Examiner* — Lex Malsawma
(74) *Attorney, Agent, or Firm* — Abel Law Group, LLP

(57) ABSTRACT

A technique for forming an encapsulated microelectromechanical system (MEMS) device includes forming an integrated circuit using a substrate, forming a barrier using the substrate, and forming a MEMS device using the substrate. The method includes encapsulating the MEMS device in a cavity. The barrier is disposed between the integrated circuit and the cavity and inhibits the integrated circuit from outgassing into the cavity. The barrier may be substantially impermeable to gas migration from the integrated circuit.

20 Claims, 3 Drawing Sheets

(56) References Cited

U.S. PATENT DOCUMENTS

| | | | |
|---|---|---|---|
| 2002/0017834 | A1 | 2/2002 | MacDonald |
| 2002/0130916 | A1 | 9/2002 | Gulvin et al. |
| 2002/0179921 | A1 | 12/2002 | Cohn |
| 2003/0210453 | A1 | 11/2003 | Noda |
| 2004/0029360 | A1 | 2/2004 | Geefay et al. |
| 2004/0046245 | A1 | 3/2004 | Minervini |
| 2004/0061618 | A1 | 4/2004 | Haueis |
| 2004/0077121 | A1 | 4/2004 | Maeda et al. |
| 2004/0115856 | A1 | 6/2004 | Jung et al. |
| 2004/0150829 | A1 | 8/2004 | Koch et al. |
| 2004/0214380 | A1 | 10/2004 | Leib et al. |
| 2005/0002084 | A1 | 1/2005 | Wan |
| 2005/0167795 | A1 | 8/2005 | Higashi |
| 2005/0168306 | A1 | 8/2005 | Cohn et al. |
| 2005/0250253 | A1 | 11/2005 | Cheung |
| 2006/0062420 | A1 | 3/2006 | Araki |
| 2006/0076634 | A1 | 4/2006 | Palmateer et al. |
| 2006/0076648 | A1 | 4/2006 | Gally et al. |
| 2006/0105503 | A1 | 5/2006 | Ding et al. |
| 2007/0189558 | A1 | 8/2007 | Ogura et al. |
| 2007/0273728 | A1 | 11/2007 | Bryant et al. |
| 2008/0089536 | A1 | 4/2008 | Josefsson |
| 2008/0128901 | A1* | 6/2008 | Zurcher et al. ............... 257/724 |
| 2009/0041270 | A1 | 2/2009 | Schrank et al. |
| 2010/0032775 | A1* | 2/2010 | Morris et al. ............... 257/415 |
| 2010/0127340 | A1* | 5/2010 | Sugizaki ............... 257/415 |
| 2013/0043547 | A1* | 2/2013 | Chu et al. ............... 257/415 |

OTHER PUBLICATIONS

"This Month in Physics History. May 1801: Thomas Young and the Nature of Light", APS Physics, vol. 17, No. 5, (May 2008), 2 pages.

"Wave Optics, Interference", http://physics.ucsd.edu/students/courses/fall2009/physics1c/documents/5.1Two-slitinterference.pdf, (2009), pp. 1-6.

CliffsNotes.com. Wave Optics. http://www.cliffsnotes.com/study_guide/topicArticleId-10453,articleId-10442.html, (Jun. 20, 2012) 3 pages.

thefreedictionary.com. Interference. http://encyclopedia2.thefreedictionary.com/p/Interferenc%20(wave%20motion), (2012), downloaded Sep. 6, 2012, 4 pages.

Wolf, "The Optics of Microscope Image Formation", Methods in Cell Biology, 72, (2003): pp. 11-43.

Fedder, G.K. et al. "Technologies for Cofabricating MEMS and Electronics," Proceedings of the IEEE, vol. 96 (2), 2008, pp. 306-322.

Carcia, P.F. et al., "Gas diffusion ultrabarriers on polymer substrates using Al2O3 atomic layer deposition and SiN plasma-enhanced chemical vapor deposition," Journal of Applied Physics 106, 2009, 6 pages.

Jen, Shih-Hui et al., "Critical tensile and compressive strains for cracking of Al2O3 films grown by atomic layer deposition," Journal of Applied Physics, vol. 109, Issue 8, Apr. 15, 2011, p. 084305-084305-11.

Ebrahimi, Maryam, "Atomic Layer Deposition (ALD)," downloaded Nov. 30, 2012 from www.chembio.uoguelph.ca/educmat/chm753/Third%20Class/Third.html, 15 pages.

Hirvikorpi, T., et al., "Thin Inorganic Barrier Coatings for Packaging Materials," PLACE 2010 Conference, Albuquerque, NM, Apr. 18-21, 2010, 41 pages.

Srinivasan, T., "Wafer-toWafer Bonding and Packaging," downloaded on Nov. 14, 2012 from www-bsac.eecs.berkeley.edu/projects/ee245/Lectures/lecturepdfs/Lecture%2025%20Wafer%20Bonding%20and%20Packaging.pdf, 20 pages.

U.S. Appl. No. 12/124,043, filed May 20, 2008, entitled "Encapsulated MEMS Device and Method to Form the Same", inventors Qing Gan and Emmanuel P. Quevy.

* cited by examiner

GAS-DIFFUSION BARRIERS FOR MEMS ENCAPSULATION

BACKGROUND

1. Field of the Invention

The invention is related to microelectromechanical systems (MEMS) and more particularly to manufacturing MEMS structures.

2. Description of the Related Art

In general, co-fabrication of microelectromechanical systems (MEMS) with integrated circuits achieves higher performance systems at lower cost. The use of materials for structural and sacrificial layers (e.g., poly-silicon-germanium and poly-germanium) that have a sufficiently low thermal budget (e.g., can be processed using steps at temperatures below 450 degrees Celsius) will not affect the integrated circuits and allows the fabrication of MEMS by surface micromachining after the completion of an integrated circuit process, such as complementary metal oxide semiconductor (CMOS). Encapsulation of the MEMS is feasible using any of a variety of technologies (e.g., die-level packaging or wafer-level packaging using bulk wafer caps, micro-assembled caps, in situ caps, or other suitable techniques). The resulting device is encapsulated by a microcap with a cavity containing the MEMS.

For proper MEMS device operation, the cavity pressure should remain stable during a specified lifetime of the device. Typically, a relatively high temperature anneal is performed prior to encapsulation, to facilitate outgassing of any species adsorbed on the MEMS or integrated circuit surfaces or any mobile species located in the bulk of the surface films. The stability of cavity pressure is increased by introducing one or more getter materials in the cavity to scavenge residual gases during and after sealing of the cavity. A typical getter is a coating applied to a surface within the evacuated chamber. When gas molecules strike the getter material, they combine chemically or by adsorption. However, getter materials may not effectively scavenge all gases. For example, getter materials may be ineffective at scavenging gases that originate in the materials used in the integrated circuit metal stack, e.g., low-k dielectric layers. Certain getter materials may also be impractical to integrate as part of the manufacturing process. Typical passivation layers on the integrated circuit (e.g., low-temperature silicon nitride and silicon dioxide ($SiO_2$) layers) are designed for mechanical protection and are not effective barriers to out-gassing during encapsulation or device operation. Accordingly, improved techniques for co-fabricating MEMS devices and integrated circuits are desired.

SUMMARY OF EMBODIMENTS OF THE INVENTION

In at least one embodiment of the invention, a method includes forming an integrated circuit using a substrate, forming a barrier using the substrate, and forming a microelectromechanical system (MEMS) device using the substrate. The method includes encapsulating the MEMS device in a cavity. The barrier is disposed between the integrated circuit and the cavity and inhibits the integrated circuit from outgassing into the cavity. The barrier may be substantially impermeable to gas migration from the integrated circuit.

In at least one embodiment of the invention, an apparatus includes an integrated circuit formed using a substrate and a microelectromechanical system (MEMS) device formed using the substrate. The MEMS device is encapsulated in a cavity and a barrier is disposed between the integrated circuit and the cavity. The barrier inhibits the integrated circuit from outgassing into the cavity. The apparatus may include a plurality of passivation layers above the integrated circuit. The barrier may be formed between one of the plurality of passivation layers and the integrated circuit.

BRIEF DESCRIPTION OF THE DRAWINGS

The present invention may be better understood by, and its numerous objects, features, and advantages made apparent to, those skilled in the art by referencing the accompanying drawings.

The use of the same reference symbols in different drawings indicates similar or identical items.

DETAILED DESCRIPTION

Figure 1A:
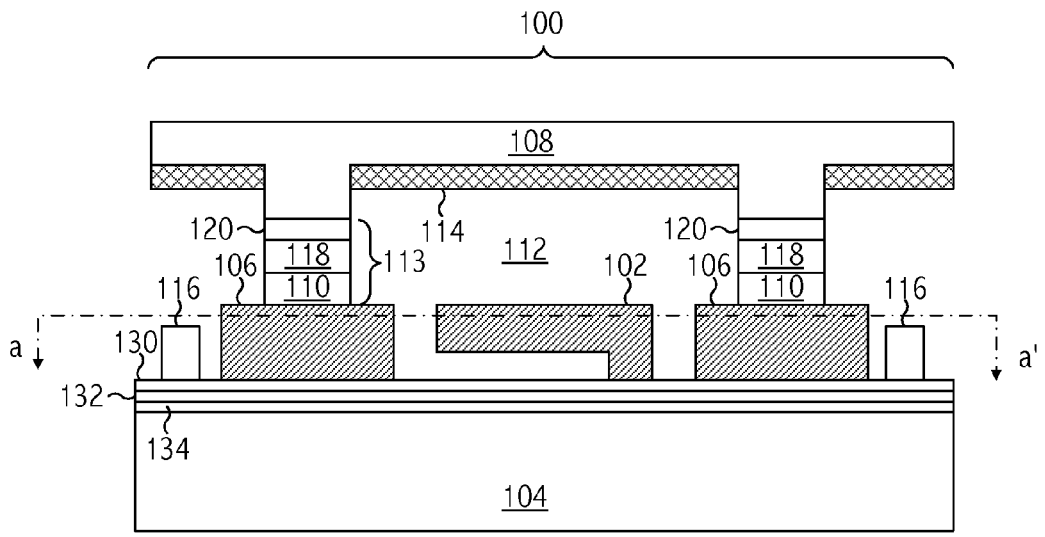
FIG. 1A illustrates a cross-sectional view of an exemplary encapsulated microelectromechanical systems device.
Figure 1B:
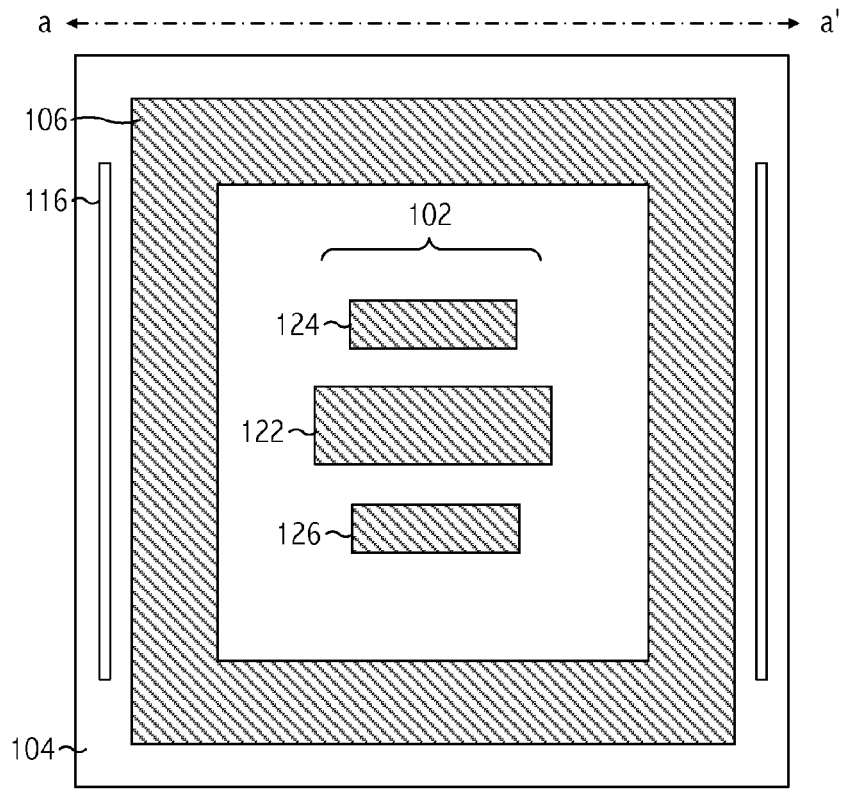
FIG. 1B illustrates a plan view of the exemplary encapsulated microelectromechanical systems device of FIG. 1A.

Referring to FIGS. 1A and 1B, exemplary microelectromechanical system structure 100 includes MEMS device 102 formed using substrate 104, which includes a CMOS integrated circuit. MEMS device 102 may be any device that falls within the scope of MEMS technologies. For example, MEMS device 102 may be any mechanical and electronic structure having a critical dimension of less than approximately 250 microns and fabricated above a substrate using lithography, deposition, and etching processes. MEMS device 102 may be a device such as, but not limited to, a resonator (e.g., an oscillator), a temperature sensor, a pressure sensor or an inertial sensor (e.g., an accelerometer or a gyroscope). MEMS device 102 may have a portion suspended from the substrate, which includes an integrated circuit (not shown). In at least one embodiment, the suspended portion of MEMS device 102 is a suspended feature having a resonant frequency. For example, the suspended portion of MEMS device 102 is a feature such as, but not limited to, a beam, a plate, a cantilever arm or a tuning fork. In a specific embodiment, MEMS device 102 includes a resonating feature 122 flanked by a driver electrode 124 and a sensor electrode 126, as depicted in FIG. 1B.

Device substrate 104 may be composed of any material suitable to withstand an integrated circuit fabrication process and a MEMS fabrication process and to provide structural integrity for a MEMS structure having a suspended portion. In an embodiment, device substrate 104 is composed of group IV-based materials such as, but not limited to, crystalline silicon, germanium or silicon-germanium. In another embodiment, device substrate 104 is composed of a III-V material. Device substrate 104 may also include an insulating layer. In at least one embodiment, the insulating layer is composed of a material such as, but not limited to, silicon dioxide, silicon nitride, silicon oxy-nitride or a high-k or a low-k dielectric layer that may be formed by typical CMOS manufacturing process. Device substrate 104 may be composed essentially of an insulator material. In at least one embodiment, device substrate 104 is composed essentially of a material such as, but not limited to, glass, quartz or sapphire.

Device substrate 104 incorporates an integrated circuit. For example, in accordance with an embodiment of the present invention, device substrate 104 includes a plurality of interconnect structures connecting a plurality of micro-electronic devices, both of which are disposed underneath MEMS device 102. In at least one embodiment, the plurality of micro-electronic devices includes a plurality of N-type and P-type transistors and the plurality of interconnect structures includes a plurality of metal interconnects that tie the plurality of N-type and P-type transistors into an integrated circuit. Device substrate 104 may further include conductive electrodes that contact underlying interconnect structures. For example, in at least one embodiment, device substrate 104 includes a plug or via (not shown) in contact with contact pads 116.

MEMS device 102 may be formed from a material suitable to withstand a MEMS fabrication process. For example, in at least one embodiment, MEMS device 102 is composed of a material such as, but not limited to, a semiconductor, an insulator, or a conductor. In at least one embodiment, MEMS device 102 is composed of a semiconductor material such as, but not limited to, silicon, germanium, silicon-germanium, carbon-doped silicon, carbon-doped silicon-germanium, or a III-V material. The semiconductor material may also be composed of dopant impurity atoms. For example, in a specific embodiment, MEMS device 102 is composed of polycrystalline silicon-germanium with a germanium atomic concentration approximately in the range of 50-70% and boron dopant impurity atoms with a total atomic concentration approximately in the range of $1 \times 10^{18}$-$5 \times 10^{20}$ atoms/cm$^3$. Furthermore, MEMS device 102 may be composed of a semiconductor material that is formed by a relatively low temperature process. In at least one embodiment, MEMS device 102 is composed of a semiconductor material formed at a temperature less than approximately 450° C. MEMS device 102 may be composed of an insulating material such as, but not limited to, silicon dioxide, silicon nitride, silicon oxy-nitride or a high-k or low-k dielectric material. In at least one other embodiment, MEMS device 102 is composed of a conductor and is formed from a material such as, but not limited to, copper, aluminum, a metal alloy or a metal silicide.

MEMS device 102 is formed on substrate 104, above the integrated circuit structures. Those integrated circuit structures include conducting portions (e.g., metal structures formed from copper, aluminum, and/or other conducting materials). Those conducting portions are protected with one or more passivation layers, which are typically glass layers (e.g., oxide or nitride with thicknesses on the order of 50 Å), to protect the CMOS circuitry from mechanical abrasion during later manufacturing procedures (e.g., probe, packaging, etc.) and to provide a barrier to contaminants (e.g., $H_2O$, ionic salts) that may damage CMOS circuitry. For example, CMOS structures formed using substrate 104 are protected using a stack of passivation layers 130, 132, and 134 (e.g., silicon-rich oxide, silicon nitride, and a cap oxide, respectively). The passivation stack serves to protect the CMOS circuitry from subsequent techniques for manufacturing MEMS device 102 and associated structures. Techniques for forming MEMS device 102 and associated structures using a substrate including an integrated circuit device are described in U.S. patent application Ser. No. 13/075,800, filed Mar. 30, 2011, entitled "Technique for Forming a MEMS Device," naming Emmanuel P. Quevy, Carrie W. Low, Jeremy Ryan Hui, and Zhen Gu as inventors, and U.S. patent application Ser. No. 13/075,806, filed Mar. 30, 2011, entitled "Technique for Forming a MEMS Device Using Island Structures," naming Emmanuel P. Quevy and Carrie W. Low as inventors, which applications are hereby incorporated by reference.

Still referring to FIG. 1A, the resulting MEMS device 102 is encapsulated. For example, a second substrate is attached to substrate 104, e.g., using a silicon-germanium seal ring 106 disposed on substrate 104 to form sealed cavity 112. Metal seal ring 110 is disposed on cap substrate 108. Metal seal ring 110 is aligned with and bonded to silicon-germanium seal ring 106 to provide sealed cavity 112. Sealed cavity 112 houses MEMS device 102, as depicted in FIG. 1A. A metal shielding layer 114 may be disposed on a surface of cap substrate 108 and is included inside of sealed cavity 112. Contact pads 116 may be included on device substrate 104, on the outside of sealed cavity 112. Metal seal ring 110 may be included in a metal seal ring stack 113 including a seed layer 118 and a dielectric layer 120, as depicted in FIG. 1A. Any suitable encapsulation technique may be used, e.g., die-level packaging or wafer-level packaging using bulk wafer caps, micro-assembled caps, in situ caps, or other suitable encapsulation techniques. Exemplary techniques for encapsulating a MEMS device are described in U.S. patent application Ser. No. 12/124,043, entitled "Encapsulated MEMS Device and Method to Form the Same," filed May 20, 2008, naming Qing Gan and Emmanuel P. Quevy as inventors, and U.S. patent application Ser. No. 13/017,844, entitled "Microshells with Integrated Getter Layer" filed Jan. 31, 2011, naming Emmanuel P. Quevy, Pezhman Monadgemi, and Roger T. Howe as inventors, which applications are hereby incorporated by reference.

Encapsulation of MEMS device 102 seals off exposure of MEMS device 102 to the environment outside of sealed cavity 112. The sealed cavity may be essentially free of contaminants, such as organic residues or moisture. Sealed cavity 112 may be hermetically sealed from the environment outside of sealed cavity 112 so that the cavity remains evacuated or pressurized with a gas or other fluidic media. The pressure inside of sealed cavity 112 may be less than the pressure outside of sealed cavity 112. For example, in an oscillator or accelerometer application, the pressure inside of sealed cavity 112 is less than approximately 100 mTorr and the pressure outside of sealed cavity 112 is approximately one atmosphere. The pressure inside of sealed cavity 112 may be approximately the same as or greater than the pressure outside of sealed cavity 112. An exemplary height of sealed cavity 112 (taken from the top surface of device substrate 104 to the surface of cap substrate 108) is in the range of approximately 60 microns to approximately 100 microns.

As discussed above, in a typical encapsulated MEMS device, to maintain a desired pressure inside the sealed cavity, a getter material is provided in the cavity to either combine with or adsorb any gasses that are released through the passivation stack from integrated circuit layers of substrate 104. In general, outgassing may result from the release of gas that was dissolved, trapped, frozen, or absorbed in materials that form the integrated circuit layers. Those gases may be released into cavity 112 from cracks or through impurities in metals and glasses in the integrated circuit layers. In general, a getter for an encapsulated MEMS device must have a large active surface area to handle the outgassing load expected in relation to the working volume of the package. In addition, the getter must be small enough to fit in sealed cavity 112, must not damage the device during a getter activation process (e.g., the getter must be activated at a low temperature to prevent damage to the integrated circuit), must exhibit high sorption performance at room temperature, must be free of particles, and must possess good mechanical strength. However, conventional getter materials may not be effective in scavenging all gases, including those that originate in materials used in the integrated circuit structures (e.g., low-k dielectric layers).

Figure 2:
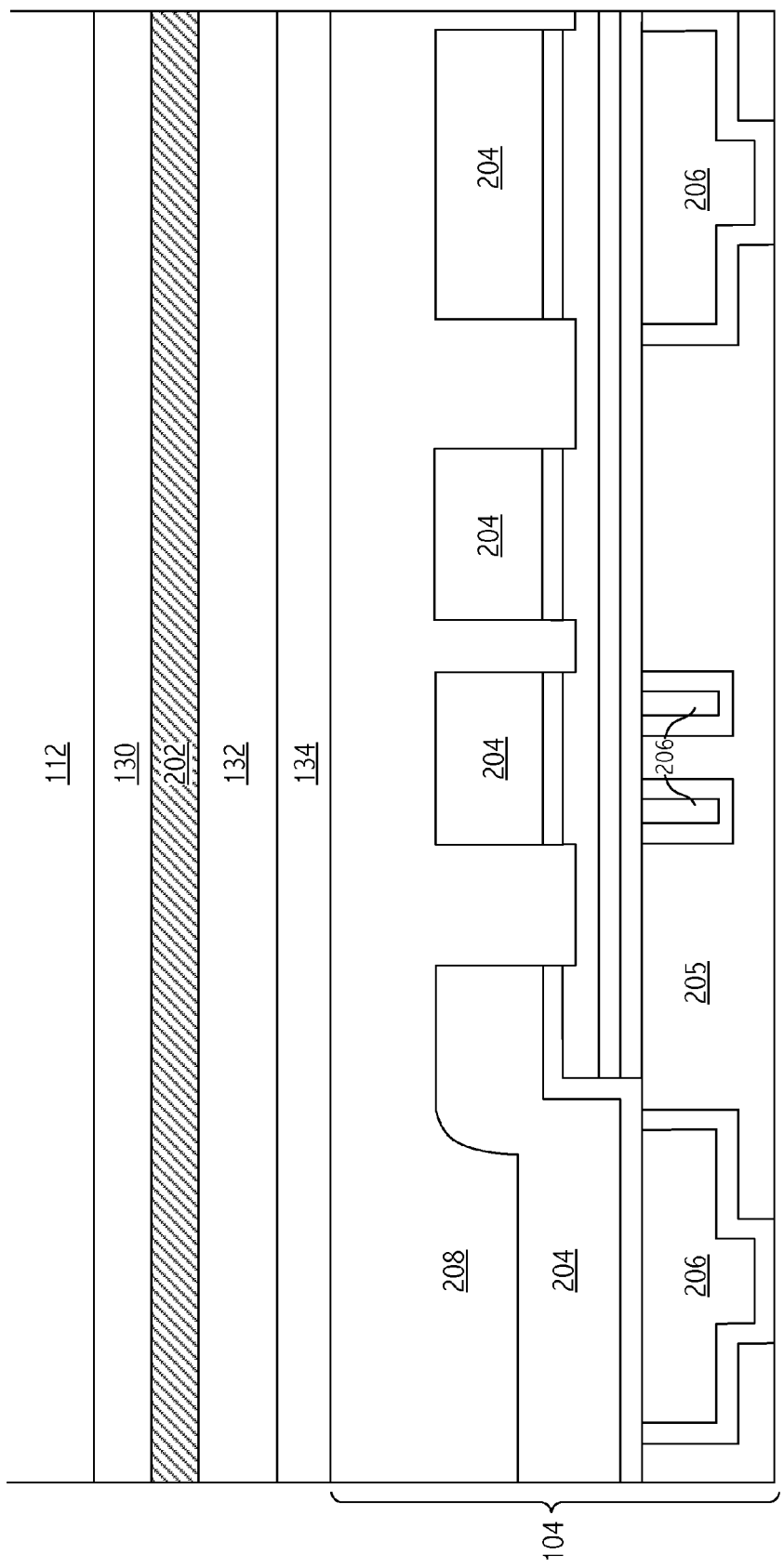
FIG. 2 illustrates a detailed cross-sectional view of a portion of an exemplary integrated circuit structure and a gas-diffusion barrier consistent with at least one embodiment of the invention.
Figure 3:
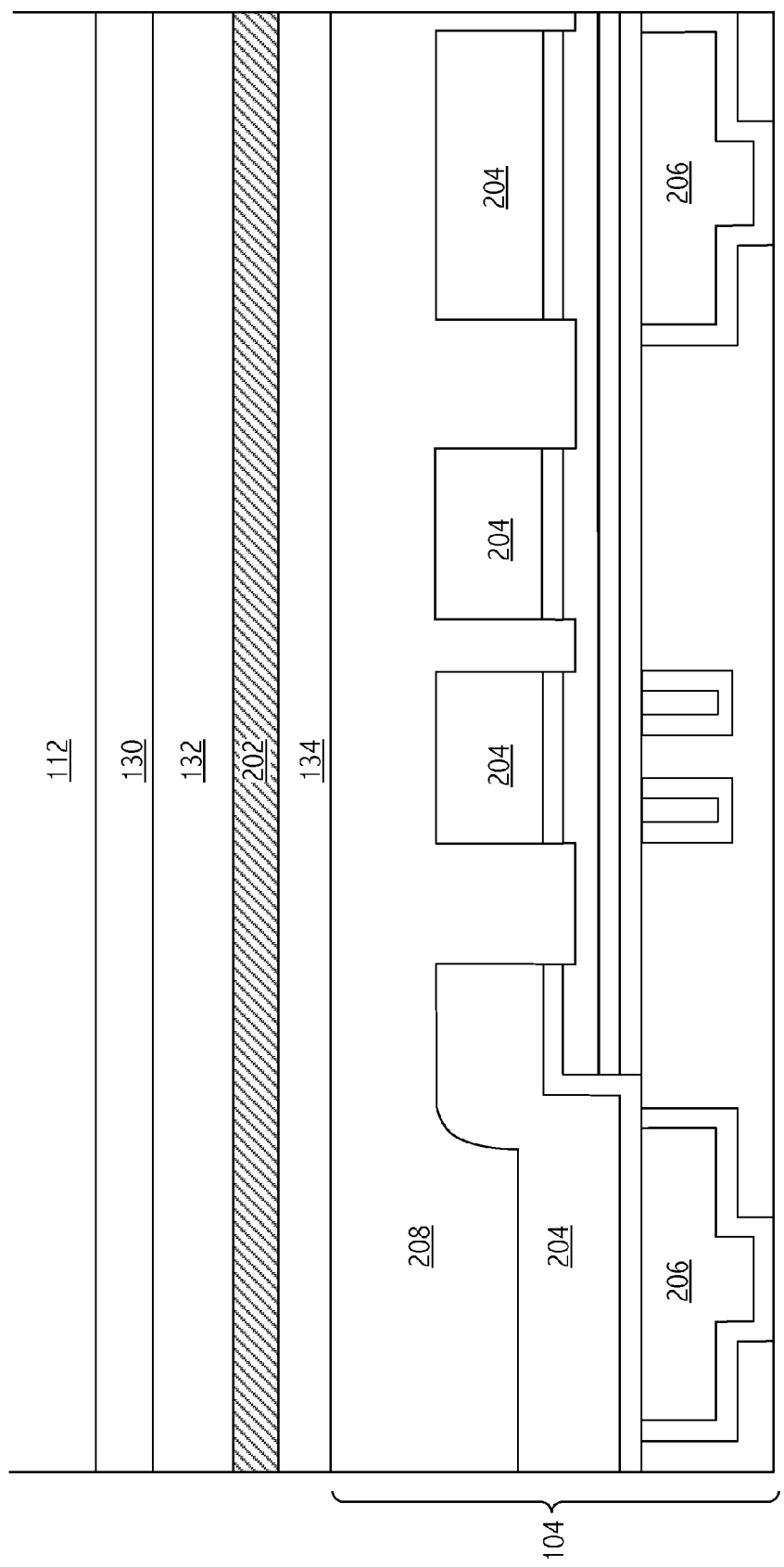
FIG. 3 illustrates a detailed cross-sectional view of a portion of an exemplary integrated circuit structure and a gas-diffusion barrier consistent with at least one embodiment of the invention.

Referring to FIGS. 2 and 3, a gas-diffusion barrier technique reduces or eliminates the release of gases from the integrated circuit structures (e.g., integrated circuit structures formed from metal structures 206 and dielectric structures 205) into sealed cavity 112. Reducing or eliminating release of those gases reduces or eliminates contamination of the MEMS device or changes to pressure in the cavity. The gas-diffusion barrier technique seals the integrated circuit and/or surface of the substrate prior to MEMS fabrication using the substrate. The gas-diffusion barrier technique uses one or more layers to form gas-diffusion barrier 202. In at least one embodiment, gas-diffusion barrier layer 202 is a thin, conformal, defect-free, insulating barrier film formed above substrate 104 above or within the passivation stack from a material that inhibits or prevents any out-gassing from the integrated circuit stack. For example, gas-diffusion barrier layer 202 may be an alumina ($Al_2O_3$) layer having a thickness in the range of 10 nm to 200 nm and is substantially impermeable to gas migration, i.e., gas diffusion barrier layer 202 has a low water vapor transfer rate (WVTR) or moisture vapor transfer rate in the range of $10^{-6}$ to $5\times10^{-3}$ grams per square meter per day (g/m$^2$/d) or less, and/or an oxygen transmission rate (OTR) in the range of $10^{-6}$ to $5\times10^{-3}$ cc/m$^2$/d.

In at least one embodiment of an integrated circuit manufacturing process, the top of the integrated circuit device is planarized to provide substantially uniform coverage above top conducting portions of the integrated circuit device (e.g., conducting portions 204). The planarization may use dielectric layer 208, e.g., a layer formed using a high-density plasma oxide using tetraethyl orthosilicate (TEOS) as a precursor. Layer 208 may itself be planarized using chemical-mechanical planarization or polishing (CMP). The exemplary integrated circuit manufacturing process includes forming one or more passivation layers on the planarized surface. An exemplary passivation stack includes silicon-rich oxide layer 134, PECVD silicon nitride layer 132, and cap oxide 130 (e.g., CVD TEOS). Gas diffusion barrier layer 202 may be formed within the passivation stack, adjacent to the silicon nitride layer 132, either below silicon nitride layer 132 (i.e., closer to the integrated circuit layers on the substrate than silicon nitride layer 132, as illustrated in FIG. 2) or above silicon nitride layer 132 (i.e., farther from the integrated circuit layers on the substrate than silicon nitride layer 132, as illustrated in FIG. 3). Accordingly, forming gas diffusion barrier layer 202 may be integrated into an integrated circuit manufacturing process flow as a single additional layer, thereby adding only one additional process step to a MEMS manufacturing process. In both FIGS. 2 and 3, barrier film 202 is below a cap oxide layer to reduce any interference with photolithography steps used to generate contacts to the integrated circuit device for the MEMS device. In at least one embodiment, gas diffusion barrier layer 202 is formed on a passivation stack after the completion of the integrated circuit.

Gas diffusion barrier layer 202 may be formed from a material that may be etched by standard etching processes, which provides for straightforward process integration. In addition, gas diffusion barrier layer 202 may be formed after completion of the integrated circuit and may be considered the first step in the MEMS process flow. Therefore, there is no need for a customization of the integrated circuit process flow or the MEMS process flow to incorporate gas diffusion barrier layer 202.

In at least one embodiment, gas diffusion barrier layer 202 is formed from amorphous silicon using low-pressure chemical vapor deposition (LPCVD). Gas diffusion barrier layer 202 may also be formed using one or more other etchable barrier materials, e.g., metal oxides and metal nitrides, in general, and more specifically, $Al_2O_3$, tantalum oxide ($TaO_5$), zirconia ($ZrO_2$), titanium nitride (TiN), titanium dioxide ($TiO_2$) stannic oxide ($SnO_2$), zinc oxide (ZnO), hafnium oxide ($HfO_2$), niobium nitride (NbN), tantalum nitride (TaN), tungsten nitride (WN), or combinations of layers thereof. Gas diffusion barrier layer 202 is formed from at least one material not typically used for passivation of an integrated circuit (i.e., at least one material other than typical passivation materials, e.g., $SiO_2$, SiN). Gas diffusion barrier layer 202 may be formed using any of a variety of techniques, e.g., dry or wet, thermal or plasma assisted/enhanced atomic layer deposition, or LPCVD.

In at least one embodiment, gas diffusion barrier layer 202 is formed using atomic layer deposition, which forms high-quality (i.e., substantially defect-free) thin films. Atomic layer deposition is a cyclic chemical vapor reaction that deposits multiple thick layers, a monolayer per cycle, and results in a conformal thin film of precisely-controlled thickness. Gas diffusion barrier layer 202 may be deposited by either thermal atomic layer deposition or plasma-enhanced atomic layer deposition. In general, atomic layer deposition is a low-temperature technique that produces dense, highly conformal, nearly pin-hole free thin films that are useful for gas diffusion barriers. Thermal atomic layer deposited films having thicknesses greater than 10 nm are excellent barriers to water vapor transport. However, films thicker than 200 nm become vulnerable to cracking due to the residual stress in the atomic layer deposited film. Accordingly, gas diffusion barrier 202 formed by thermal atomic layer deposition has a thickness in the range of approximately 10 nm and approximately 200 nm, inclusively. Multiple materials may be used together to form a multi-layer diffusion barrier, which could be deposited in a single atomic layer deposition pump-down by switching precursor gases. An atomic layer deposited gas diffusion barrier layer 202 has a total thickness in a range that is not susceptible to cracking, is etchable, is formed at a temperature less than 450 degrees Celsius, and has a reasonable deposition time (e.g., a total thickness of 200 nm or less).

In at least one embodiment of an encapsulated MEMS device, gas diffusion barrier layer 202 is formed from a plurality of diffusion barrier layers that are separated by an intervening passivation layer. The intervening passivation layer increases the diffusion distance associated with the barrier and increases efficiency of the barrier with a reasonable barrier manufacture time. The plurality of diffusion barrier layers may be thinner than the interposed passivation layer. For example, the plurality of diffusion barrier layers may be formed by thin, atomic layer deposited films and the interposing passivation layer is formed from a thicker nitride film that has a quicker formation time than an atomic layer deposited diffusion barrier film of the same thickness.

In at least one embodiment of an encapsulated MEMS device, gas diffusion barrier layer 202 is a layer of $Al_2O_3$ that is formed directly adjacent to a layer of SiN. Such combination of layers may exhibit a reduced water vapor transmission rate or oxygen transmission rate, i.e., a water vapor transmission rate that is lower than a water vapor transmission rate of a gas diffusion barrier layer 202 formed by $Al_2O_3$ in a stack including SiN but separated by an intervening material. This effect may be the result of either the $Al_2O_3$ sealing defects in the SiN PECVD film or improved nucleation of $Al_2O_3$ atomic layer deposited on SiN.

Thus, techniques for providing a gas-diffusion barrier for an encapsulated MEMS device have been provided. The description of the invention set forth herein is illustrative, and is not intended to limit the scope of the invention as set forth in the following claims. For example, while the invention has been described in an embodiment in which the gas diffusion barrier layer is formed on a planar surface, one of skill in the art will appreciate that the teachings herein can be utilized by forming the gas diffusion barrier layer on a non-planar surface. Variations and modifications of the embodiments disclosed herein, may be made based on the description set forth herein, without departing from the scope and spirit of the invention as set forth in the following claims.

What is claimed is:

1. A method comprising:
    forming a barrier above a substrate incorporating an integrated circuit, the barrier comprising a metal oxide or a metal nitride;
    forming a microelectromechanical system (MEMS) device including a portion suspended from the substrate; and
    encapsulating the MEMS device in a cavity,
    wherein the barrier is disposed between the integrated circuit and the cavity and inhibits the integrated circuit from outgassing into the cavity.

2. The method, as recited in claim 1, wherein the barrier is substantially impermeable to gas migration from the integrated circuit.

3. The method, as recited in claim 1, wherein the barrier has an oxygen transmission rate of less than approximately $5\times10^{-3}$ cc/m$^2$/d.

4. The method, as recited in claim 1, wherein the barrier comprises an electrically insulating material.

5. The method, as recited in claim 1, further comprising:
    forming a passivation layer above the integrated circuit, the barrier being formed on the passivation layer.

6. The method, as recited in claim 5, wherein the passivation layer comprises a SiN layer.

7. The method, as recited in claim 1, further comprising:
    forming a plurality of passivation layers on the integrated circuit, the barrier being formed between individual passivation layers of the plurality of passivation layers.

8. The method, as recited in claim 1, wherein forming the barrier comprises:
    forming a plurality of diffusion barrier layers; and
    forming a passivation layer interposed between individual layers of the plurality of diffusion barrier layers.

9. The method, as recited in claim 1, wherein the barrier is formed at a temperature less than 450 degrees Celsius.

10. The method, as recited in claim 1, wherein the barrier is formed using atomic layer deposition or chemical vapor deposition.

11. A microelectromechanical system formed by the method of claim 1.

12. The method as recited in claim 1, wherein the barrier has a thickness t, where 10 nm $\leq$ t $\leq$200 nm.

13. The method, as recited in claim 1, wherein the barrier comprises at least one of an Al$_2$O$_3$ layer, a Ta$_2$O$_5$ layer, a ZrO$_2$ layer, a TiN layer, a TiO$_2$ layer, a SnO$_2$ layer, a ZnO layer, a HfO$_2$ layer, a NbN layer, a TaN layer, a WN layer, and a layer of amorphous silicon.

14. A method comprising:
    forming a barrier above a substrate incorporating an integrated circuit;
    forming a microelectromechanical system (MEMS) device including a portion suspended from the substrate; and
    encapsulating the MEMS device in a cavity,
    wherein the barrier is disposed between the integrated circuit and the cavity and inhibits the integrated circuit from outgassing into the cavity,
    wherein the barrier has a water vapor transmission rate of approximately $5\times10^{-3}$ gm/m$^2$/d or less.

15. The method as recited in claim 14, wherein the barrier has a thickness t, where 10 nm $\leq$ t $\leq$200 nm.

16. The method, as recited in claim 14, wherein the barrier comprises at least one of an Al$_2$O$_3$ layer, a Ta$_2$O$_5$ layer, a ZrO$_2$ layer, a TiN layer, a TiO$_2$ layer, a SnO$_2$ layer, a ZnO layer, a HfO$_2$ layer, a NbN layer, a TaN layer, a WN layer, and amorphous silicon.

17. The method, as recited in claim 14, wherein the barrier comprises a layer of Al$_2$O$_3$ directly adjacent to a layer of SiN.

18. A method comprising:
    forming a barrier above a substrate incorporating an integrated circuit, the barrier having a thickness t, where 10 nm $\leq$ t $\leq$200 nm;
    forming a microelectromechanical system (MEMS) device including a portion suspended from the substrate; and
    encapsulating the MEMS device in a cavity,
    wherein the barrier is disposed between the integrated circuit and the cavity and inhibits the integrated circuit from outgassing into the cavity.

19. The method as recited in claim 18, wherein the barrier comprises at least one of an Al$_2$O$_3$ layer, a Ta$_2$O$_5$ layer, a ZrO$_2$ layer, a TiN layer, a TiO$_2$ layer, a SnO$_2$ layer, a ZnO layer, a HfO$_2$ layer, a NbN layer, a TaN layer, and a WN layer.

20. The method as recited in claim 18, wherein the barrier comprises amorphous silicon.

* * * * *